US011601090B1

(12) United States Patent
Krishnamurthi

(10) Patent No.: US 11,601,090 B1
(45) Date of Patent: Mar. 7, 2023

(54) RADIO FREQUENCY TRIPLER SYSTEMS AND METHODS THEREOF

(71) Applicant: Intrinsix Corp., Marlborough, MA (US)

(72) Inventor: Kathiravan Krishnamurthi, Westford, MA (US)

(73) Assignee: INTRINSIX CORP., Marlborough, MA (US)

( * ) Notice: Subject to any disclaimer, the term of this patent is extended or adjusted under 35 U.S.C. 154(b) by 0 days.

(21) Appl. No.: 17/463,057

(22) Filed: Aug. 31, 2021

(51) Int. Cl.
| | |
|---|---|
| *H03B 19/00* | (2006.01) |
| *H03B 19/14* | (2006.01) |
| *H03B 19/18* | (2006.01) |
| *H04B 1/10* | (2006.01) |
| *H04B 1/40* | (2015.01) |

(52) U.S. Cl.
CPC ............. *H03B 19/14* (2013.01); *H03B 19/18* (2013.01); *H04B 1/1036* (2013.01); *H04B 1/40* (2013.01); *H04B 2001/1063* (2013.01); *H04B 2001/1072* (2013.01)

(58) Field of Classification Search
CPC ........ H03B 19/00; H03B 19/10; H03B 19/14; H04B 1/1036; H04B 1/40; H03K 5/00006
USPC .......................... 327/116, 119, 120, 121, 122
See application file for complete search history.

(56) References Cited

U.S. PATENT DOCUMENTS

| | | | |
|---|---|---|---|
| 6,549,096 B2 | 4/2003 | Groves et al. | |
| 6,707,344 B2 * | 3/2004 | Cargill | H03B 19/14 |
| | | | 331/74 |
| 10,411,680 B1 * | 9/2019 | Lin | H03K 5/00006 |
| 10,637,398 B1 * | 4/2020 | Krishnamurthi | H03D 7/1433 |
| 2021/0091757 A1 | 3/2021 | Pirbazari et al. | |

FOREIGN PATENT DOCUMENTS

EP 3796551 A 3/2021

OTHER PUBLICATIONS

Liu, Yongjie et al., "A High Efficiency Balanced Frequency Tripler Incorporating Compensation Structure for Millimeter-Wave Applications", Progress in Electromagnetics Research C, vol. 59, pp. 79-88, 2015.
Jackson, B et al., "A Frequency Tripier Using a Subharmonic Mixer and Fundamental Cancellation", IEEE Transactions on Microwave Theory and Techniques, vol. 57, No. 5, May 2009.
U.S. Appl. No. 17/362,015, filed Jun. 29, 2021, "Differential Tuned Inductor Devices and Methods Thereof".
Domino, William, et al., "Polynomial Model of Blocker Effects on Small Signal Gain and Noise Figure for LNA/Mixer Devices Used in Wireless Receivers," RF Cafe (Article previously published in the Jun. 2001 edition of Applied Microwave & Wireless, which is no longer in print).

* cited by examiner

*Primary Examiner* — Hai L Nguyen
(74) *Attorney, Agent, or Firm* — Troutman Pepper Hamilton Sanders LLP (Rochester)

(57) ABSTRACT

This frequency tripler system uses a cascade of integrated transistor circuit differential limiting amplifiers and tunable notch filters that can directly serve one or more outputs, such as a direct clock or local oscillator drive. With this topology, filtering is distributed between two or more stages of differential limiting amplifiers and tunable notch filters. This enables suppression of smaller fundamental tone by the differential limiting amplifiers along with the tunable notch filters and yields a strong third harmonic signal to directly drive high performance mixers and digital-to-analog converters.

14 Claims, 10 Drawing Sheets

RADIO FREQUENCY TRIPLER SYSTEMS AND METHODS THEREOF

FIELD

This technology generally relates to systems and methods for RF frequency tripling and, more particularly, to electronic frequency tripler systems having a cascade of differential limiting amplifiers and tunable filters to achieve tripled frequency with fundamental suppression to serve one or more outputs, such as a direct clock or local oscillator drive.

BACKGROUND

Frequency multipliers, such as frequency doublers and frequency triplers, are used to generate accurate and low-noise sources for many applications in radar and synthesizers. The inherent square law nonlinearity in semiconductor diode devices can be employed for the realization of frequency doublers which are reasonable efficient. However, when compared with frequency doublers, prior frequency triplers are generally very inefficient.

By way of example, a prior art frequency tripler or third harmonic generator 10 at microwave frequencies is illustrated in FIG. 1(a). This prior art frequency tripler 10 uses an antiparallel diode pair (D1 and D2) that has odd symmetry in its nonlinear I-V characteristic. Additionally, matched pair of devices, such as this diode pair (D1 and D2), are not easily available in discrete diode device technology This type of frequency tripler 10 also is lossy (>10 dB) and needs a fair bit of drive (>10 dBm). The output of this type of frequency tripler 10 needs to be gained up before driving a mixer or a digital-analog-converter (DAC). Further, this type of frequency tripler 10 needs bandpass filters (F1 and 3F) which are lossy and also are not easy to realize in integrated circuit technology with low-loss. Overall, this type of prior art frequency tripler 10 is cumbersome to design and suffers lack of isolation between input and output ports.

Another type of prior art frequency tripler 12 with a doubler drive 14 and mixer 16 is illustrated in FIG. 1(b). The mixer 16 produces a fundamental signal and third harmonic signal at equal levels. With this type of prior art frequency tripler 12, phase cancellation or filtering of the fundamental harmonic is needed. Additionally, with this type of frequency tripler 12 the second harmonic generation and mixing are all lossy, inefficient, and require quite a bit of further amplification of the third harmonic signal and filtering with a filter 18 before being able to effectively serve one or more outputs, such as a direct clock or local oscillator drive.

SUMMARY

Examples of this technology uses a cascade of integrated transistor technology differential limiting amplifiers and tunable notch filters to achieve third harmonic generation that can directly serve one or more outputs, such as a direct clock or local oscillator drive. With this technology, filtering is advantageously distributed between two or more stages of differential limiting amplifiers and tunable notch filters. Further, this technology enables effective suppression of fundamental signal or tone (f) by the differential limiting amplifiers along with the tunable notch filters while yielding a strong third harmonic signal to serve one or more outputs, such as drive mixers and digital-to-analog converters.

In one example, a frequency tripler system comprises a plurality of differential limiting amplifiers and tunable notch filters, where the first differential limiting amplifier generates odd harmonics along with a strong fundamental signal or tone (f) at an output. A first tunable notch filter attenuates the fundamental signal or tone (f) to a level smaller than a third harmonic signal into the second differential limiting amplifier. The second and subsequent differential limiting amplifiers operate in a way to suppress the gain of the fundamental signal or tone (f) with respect to the third harmonic signal. The second and subsequent tunable notch filter sections further attenuate the fundamental signal or tone (f) while passing out a triple frequency signal.

In another example, the differential limiting amplifiers in an exemplary frequency tripler system may have an source-coupled bipolar differential pair (or cascode) working with a notch filter comprising a spiral inductor L in series with a capacitor C to short circuit the fundamental tone and pass the third harmonic to the next stage. A higher order filter may have an additional series differentially tunable inductor in parallel with a capacitor C. With another example, the differential limiting amplifier in an exemplary frequency tripler system may have a source-coupled metal-oxide semiconductor differential pair (or cascode) working with a notch filter comprising a shunt spiral inductor L in series with a capacitor C to short circuit the fundamental signal or tone (f) and pass the third harmonic to the next stage, followed by a series section of parallel L and C.

An example of a frequency tripler system includes a cascade of a plurality of differential limiting amplifiers and a plurality of notch filters. One of the notch filters is coupled in series after each one of the plurality of differential limiting amplifiers. A first pair of one of the differential limiting amplifiers coupled in series with a first one of the plurality of notch filters is configured to generate a third harmonic signal with fundamental signal. Subsequent pairs of one of the other ones of the differential limiting amplifiers coupled in series with one of the other ones of the plurality of notch filters are configured to pass the triple frequency signal and provide suppression of the fundamental signal. One or more last pairs of one of the other ones of the differential limiting amplifiers coupled in series with one of the other ones of the plurality of notch filters each have an output configured to provide the triple frequency signal. Accordingly, with this unique configuration of the first and then subsequent stages, suppression levels greater than 80 dB can be achieve enabling outputs, such as a clock or local oscillator port, to be driven without external filters.

Another example of a method for making a frequency tripler system includes providing a plurality of differential limiting amplifiers and coupling one of a plurality of notch filters in series after each one of the plurality of differential limiting amplifiers. A first pair of a first one of the differential limiting amplifiers coupled in series with a first one of the plurality of notch filters is configured to generate to generate a third harmonic signal with fundamental signal. Subsequent pairs of one of the other ones of the differential limiting amplifiers coupled in series with one of the other ones of the plurality of notch filters are configured to pass the triple frequency signal and provide suppression of the fundamental signal. One or more last pairs of one of the other ones of the differential limiting amplifiers coupled in series with one of the other ones of the plurality of notch filters each have an output configured to provide the triple frequency signal.

DETAILED DESCRIPTION

Figure 1:
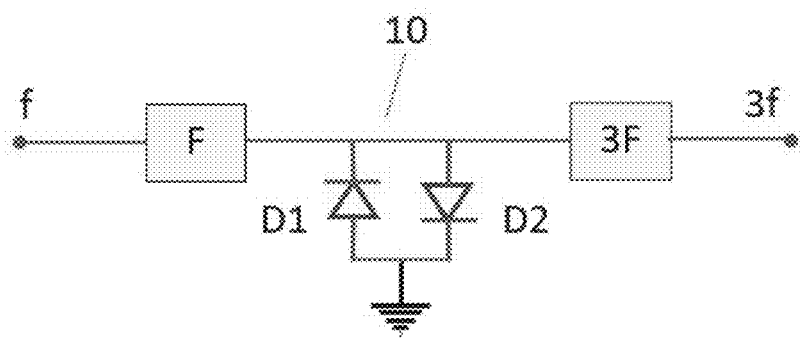
FIG. 1(a) is a circuit diagram of a prior art frequency tripler that has an anti-parallel diode mixer.
FIG. 1(b) is a circuit diagram of a prior art frequency tripler which has a doubler drive followed by a mixer.
Figure 1:
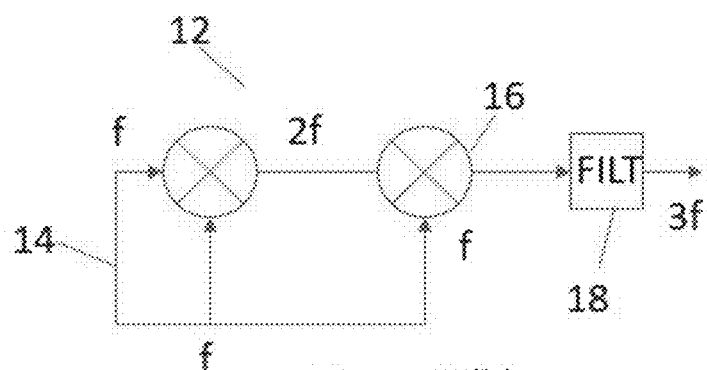
Figure 2:
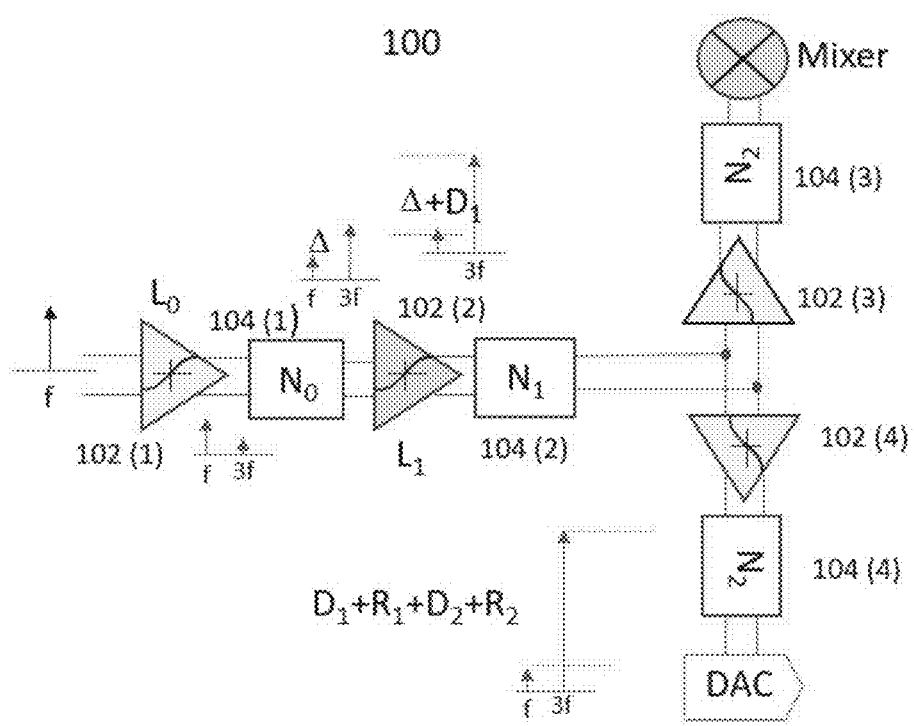
FIG. 2 is a circuit diagram of an example of a radio frequency tripler system with a cascade of differential limiting amplifiers followed by tunable notch filters to serve one or more outputs.

An exemplary radio frequency tripler system 100 is illustrated in FIG. 2. In this example, the radio frequency tripler system 100 includes a cascade of differential limiting amplifiers 102(1)-102(4) each followed by one of a plurality of tunable notch filters 104(1)-104(4), although frequency tripler system may have other types and/or numbers of other components or other elements in other configurations. This technology provides a number of advantages including providing improved frequency tripler systems that have a cascade of differential limiting amplifiers and tunable filters to achieve tripled frequency with effective fundamental signal or tone suppression to serve one or more outputs, such as a direct clock or local oscillator drive. Additionally, examples of this technology can easily and cost effectively be implemented into integrated circuit technology.

Referring more specifically to FIG. 2, an example of a radio frequency tripler system 100 that has a cascade of differential limiting amplifiers 102(1)-102(4) (Also referred to herein as L0, L1, L2, etc.) each followed by one of the tunable notch filters 104(1)-104(4) (Also referred to herein as N0, N1, N2, etc.) to feed a tripled frequency to one or more outputs 106(1)-106(2), such as a DAC clock and a local oscillator port of a microwave mixer by way of example. In a first stage comprising the differential limiting amplifier 102(1) and the tunable notch filter 104(1) in this example, the differential limiting amplifier 102(1) generates odd harmonics along with a strong fundamental signal or tone (f) at an output. Additionally, in this example the first tunable notch filter 104(1) attenuates the fundamental signal or tone (f) to a level smaller than a third harmonic signal (3f) leading into the second differential limiting amplifier. Accordingly, in this example the differential limiting amplifier 102(1) or L0 produces strong fundamental signal or tone (f) and a third harmonic signal (3f). Next, in this first stage the tunable notch filter 104(1) or N0 suppresses or knocks the fundamental signal or tone (f) below third harmonic signal (3f) as illustrated in FIG. 2 with the exemplary illustration of the fundamental signal or tone (f) and the third harmonic signal (3f).

In second and subsequent stages or pairs comprising: the differential limiting amplifier 102(2) and the tunable notch filter 104(2); the differential limiting amplifier 102(3) and the tunable notch filter 104(3); and the differential limiting amplifier 102(4) and the tunable notch filter 104(4) in this example, the second and subsequent differential limiting amplifiers 102(2)-102(4) operate in a way to suppress the gain of the fundamental signal or tone (f) with respect to the third harmonic signal (3f). The last tunable notch filters 104(3)-104(4) in this example further attenuate the fundamental signal or tone (f) while passing out a triple frequency signal at one or more outputs 106(1)-106(2). In this example, active splitting is used to feed multiple outputs 106(1)-106(2), such as a DAC or a mixer, although this technology may be configured to have fewer or more outputs. Drive levels on the order of 1.5 Vp can be generated by this example to drive a 100 ohm or 200 ohm differential DAC and mixer local oscillator port. In this example, the second and subsequent stages or pairs are configured to pass the triple frequency signal and provide suppression of the fundamental signal relative to the third harmonic signal (3f) by desensitization. Accordingly, with these second and subsequent stages or pairs the suppression of the fundamental tone or signal (f) output by these second and subsequent stages or pairs is suppressed below the relative to the third harmonic signal (3f). In particular, in this example the differential limiting amplifier 102(1) or L1 (the second one) also operates in a mode that suppresses the fundamental signal or tone (f) further as illustrated with the exemplary delta between 3f and f in FIG. 2. Thus, in examples of this technology, the differential limiting amplifier 102(1) or L1 as well as others differential limiting amplifiers in subsequent stages also operate to further suppress the unwanted fundamental signal or tone (f) in this unique configuration. Accordingly, with this unique configuration of the first and then subsequent stages, suppression levels greater than 80 dB can be achieve enabling outputs, such as a clock or local oscillator port, to be driven without external filters.

With this example of the technology, filtering is advantageously distributed between two or more stages of differential limiting amplifiers 102(1)-102(4) and tunable notch filters 104(1)-104(4). Further, this technology enables effective suppression of fundamental signal or tone (f) by the differential limiting amplifiers 102(1)-102(4) along with the tunable notch filters 104(1)-104(4) while yielding a strong third harmonic signal (3f) to serve one or more outputs, such as drive mixers and digital-to-analog converters. As illustrated in this example, the exemplary frequency tripler system 100 uses a distributed approach to the filtering following limiting. The fundamental tone is suppressed (desensitized) by the third harmonic to give extra rejection along the chain or stages of the exemplary frequency tripler system 100.

Referring to FIGS. 3-6, an example of one of the differential limiting amplifiers 102(2) is illustrated, although the differential limiting amplifier 102(2) could have other types and/or numbers of other components and/or other elements in other configurations, such as a fixed limiting amplifier may be used. Additionally, in this example the other ones of the differential limiting amplifiers 102(1) and 102(3)-102(4) are the same in structure and operation as the differential limiting amplifier 102(2), although one or more could have other types and/or numbers of other components and/or other elements in other configurations, such as being a fixed limiting amplifier.

Figure 3:
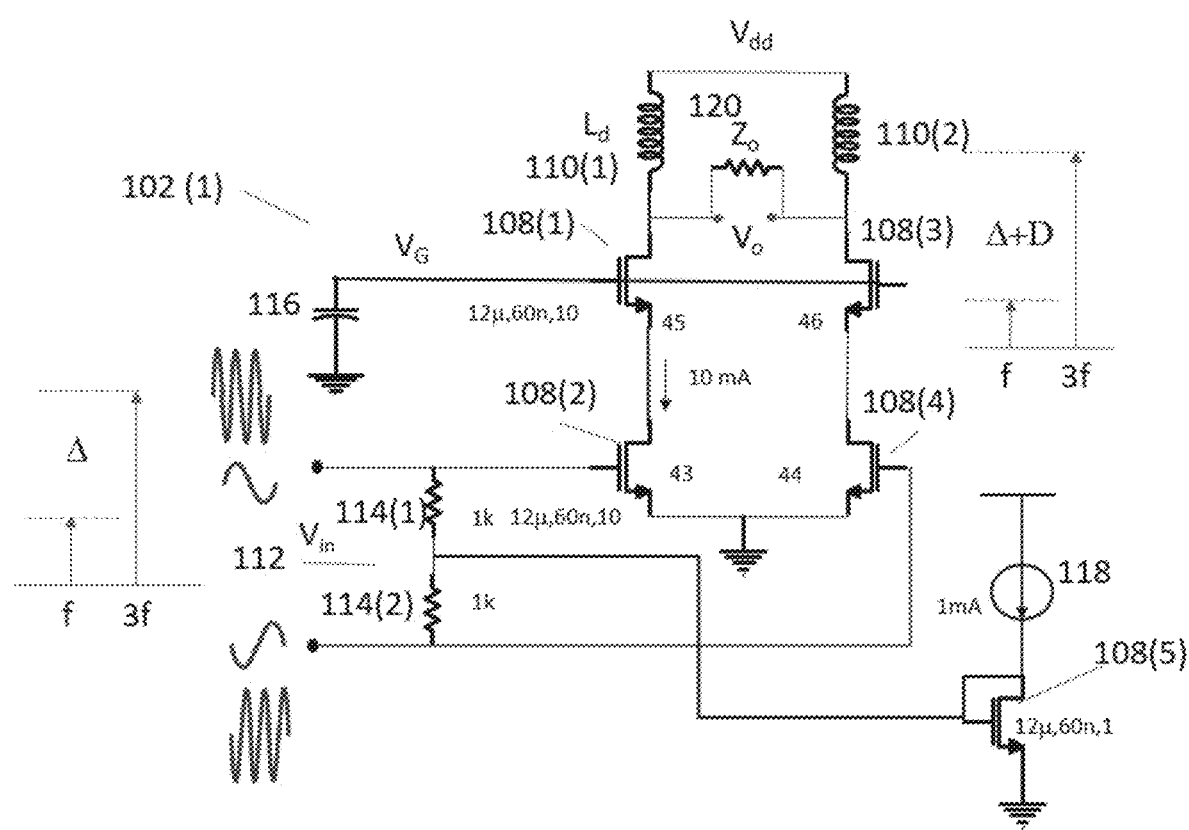
FIG. 3 is circuit diagram of an exemplary MOS differential limiting amplifier that provides fundamental suppression.

Referring more specifically to FIG. 3, in this example the differential limiting amplifier 102(2) is located in a second stage and comprises a source-coupled metal-oxide semiconductor differential pair (or cascode) that includes MOS transistors 108(1)-108(5), spiral inductors 110(1)-110(2), input terminals 112, resistors 114(1)-114(2), capacitor 116, current source 118, and output terminals 120, although the differential limiting amplifier could have other types and/or numbers of other components and/or other elements in other configurations. By way of example only, the differential limiting amplifier 102(2) may comprise an source-coupled bipolar differential pair (or cascode) or may comprise source coupled MOS or Gallium FET, Gallium Arsenide MESFETs, pHEMTS, or Gallium Nitride transistors as well.

In this example, the input terminals 112 are coupled across resistors 114(1)-114(2), which are coupled in series and each have matching resistance values, and are respectively coupled to the gates of MOS transistors 108(2) and 108(4). A gate of MOS transistor 108(5) is coupled between resistors 114(1)-114(2) and to the source of MOS transistor 108(5). A current source 118 is coupled to a source of transistor 108(5) and the drain of the MOS transistor 108(5) is coupled to ground.

The source of MOS transistors 108(2) and 108(4) are coupled, respectively, to one of the drains of MOS transistors 108(1) and 108(3). A gate of MOS transistors 108(1) and 108(3) are coupled to the capacitor 116 which is coupled to ground. A source of MOS transistors 108(1) and 108(3) are each coupled, respectively, to one of the spiral inductors 110(1)-110(2) which are coupled to a voltage source $V_{dd}$. An output $V_o$ 120 is between the source of MOS transistors 108(1) and 108(3) and the spiral inductors 110(1)-110(2).

Figure 4:
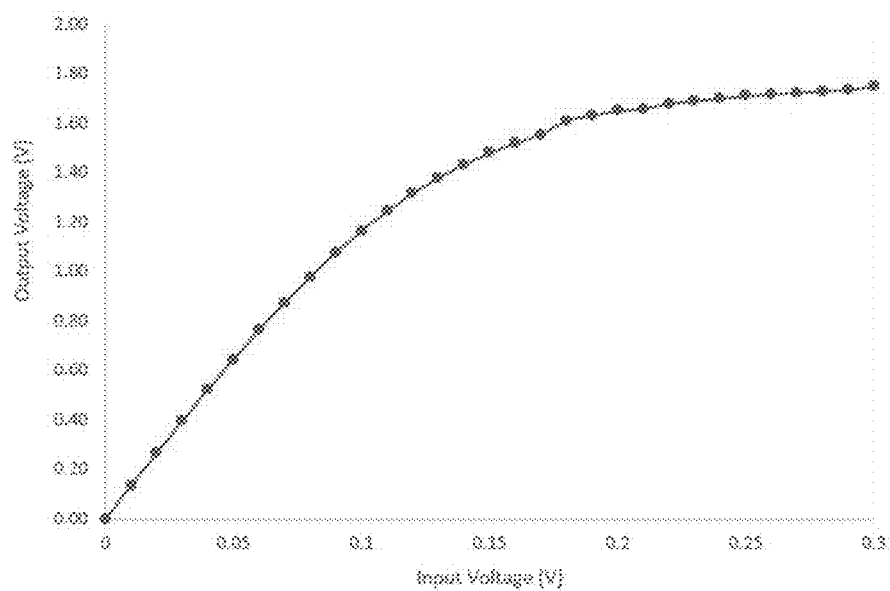
FIG. 4 is a graph of limiter characteristics of the exemplary bipolar differential limiting amplifier.

Referring to FIG. 4, a graph of an exemplary input-output characteristic at the drive frequency for a bipolar differential limiting amplifier. RF input and output voltage response is plotted as the input drive increases. The nonlinear function is symmetric with respect to the input voltage. The sign reversal at the input 112 as shown in FIG. 3 reverses the phase of the output and results in odd harmonic generation.

In the example shown and described with reference to FIGS. 3-6, the input-output relationship of the differential limiting amplifier 102(2) can be expressed with a polynomial expression:

$$V_o = k_1 V_{in} + k_3 V_{in}^3 + k_5 V_{in}^5$$

It can be shown that the large-signal gain is more than the small signal gain. This property of the differential limiting amplifier 102(2) is very useful in achieving a large third harmonic swing while also achieving fundamental signal or tone suppression.

$$LSG = k_1 - \frac{3}{4} k_3 V_{large}^2 + \frac{5}{8} k_5 V_{large}^4$$

$$SSG = k_1 - \frac{3}{8} k_3 V_{large}^2 + \frac{15}{8} k_5 V_{large}^4$$

Figure 5:
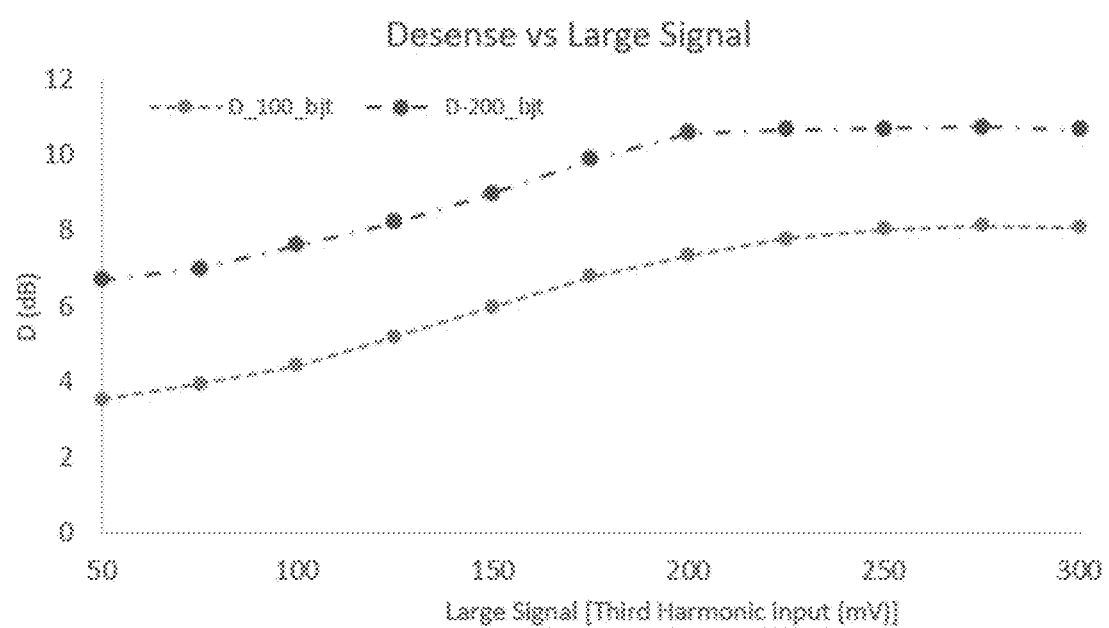
FIG. 5 is a graph of an example of a desensitization characteristic of the bipolar differential limiting amplifier.
Figure 6:
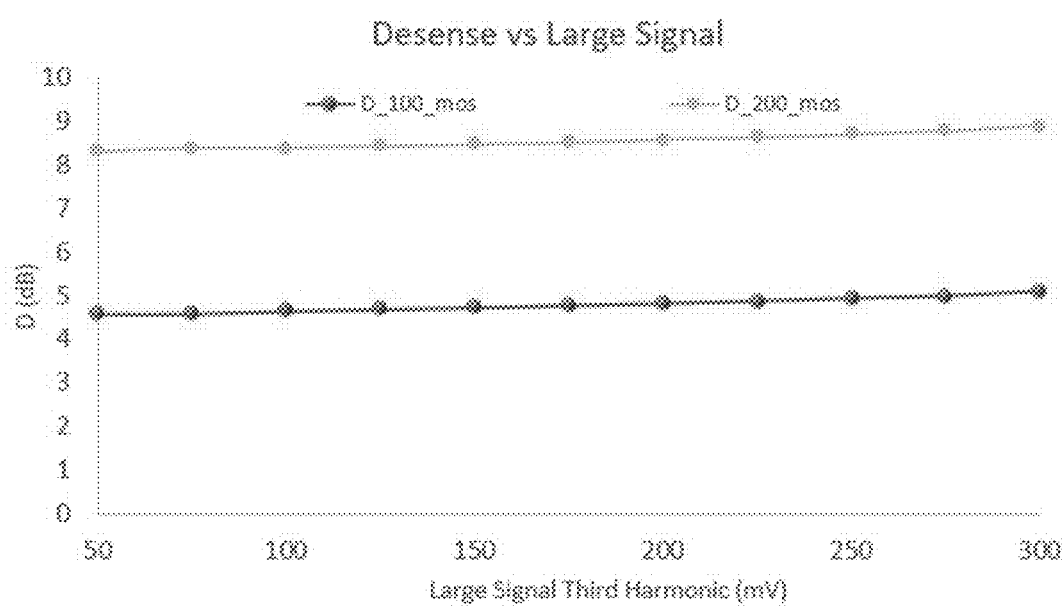
FIG. 6 is a graph of an example of a desensitization characteristic of the MOS differential limiting amplifier shown in FIG. 3.

This desensing of the small signal (f) with respect to (3f) is represented by FIGS. 5 and 6. By way of example, this suppression is plotted for both bipolar and metal-oxide semiconductor based differential limiting amplifier as a function of the impedance system. In particular, FIG. 5 illustrates a graph of an example of a desensitization characteristic of the bipolar differential limiting amplifier is illustrated. FIG. 6 illustrates a graph of an example of a desensitization characteristic of the MOS differential limiting amplifier 102(2) shown in FIG. 3 is illustrated.

Referring to FIGS. 7-10, an example of the tunable notch filter 104(1) is illustrated, although tunable notch filter 104(1) could have other types and/or numbers of other components and/or other elements in other configurations, such as being a fixed notch filter. Additionally, in this example the other ones of the tunable notch filters 104(2)-104(4) are the same in structure and operation as the tunable notch filter 104(1), although one or more could have other types and/or numbers of other components and/or other elements in other configurations, such as being a fixed notch filter.

The first tunable notch filer 104(1) after differential limiting amplifier 102(1) acts to suppress the fundamental tone with respect to the third harmonic and each subsequent tunable notch filter 104(2)-104(4) in this example provides further suppression. The fundamental suppression is explained by the difference in gain between the small signal (f) and the large signal (3f) in a nonlinear differential limiting amplifier 102(1) as illustrated by way of example in FIG. 2.

Figure 8:
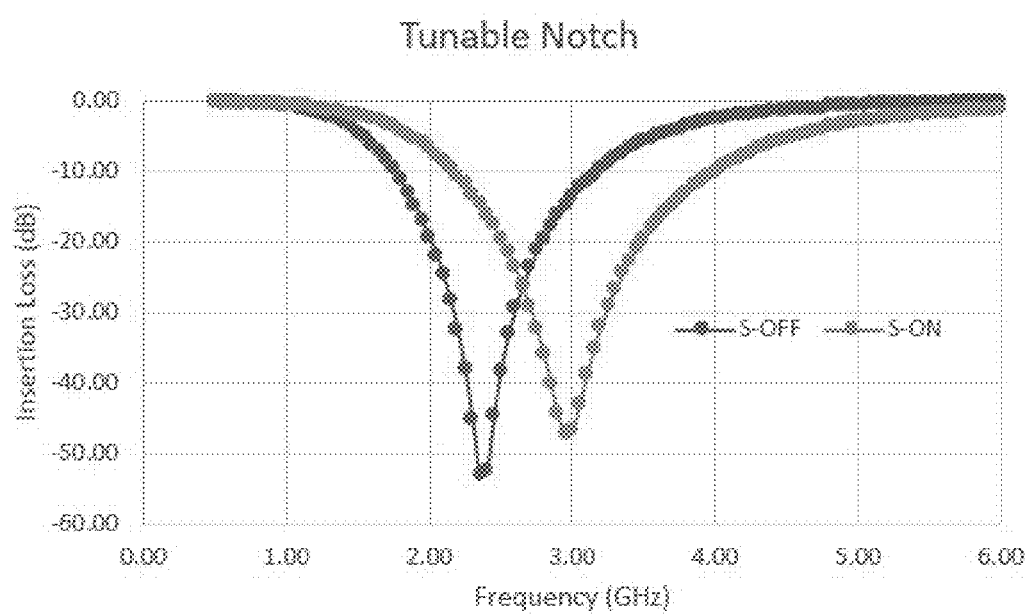
FIG. 8 is a graph of fundamental suppression of an example of characteristics of an exemplary tunable notch filter.

Another feature of examples of this technology is that the tunable notch filter 104(1) is passive and distortion free. Additionally, the tunable notch filter 104(1) in this example implements inductive tuning using tunable differential series inductors 124(1), 124(2), 132(1), and 132(2) which can effectively change the frequency response of the tunable notch filter 104(1), although again in other examples of this technology fixed notch filters may be used. This tuning broadens the response of the frequency tripler system 100 while providing sharp rejection characteristic R0, R1 etc. Differential element tuning is also done to improve the Q factor. A graph of fundamental suppression of an example of characteristics of an exemplary tunable notch filter is shown in FIG. 8.

Figure 7:
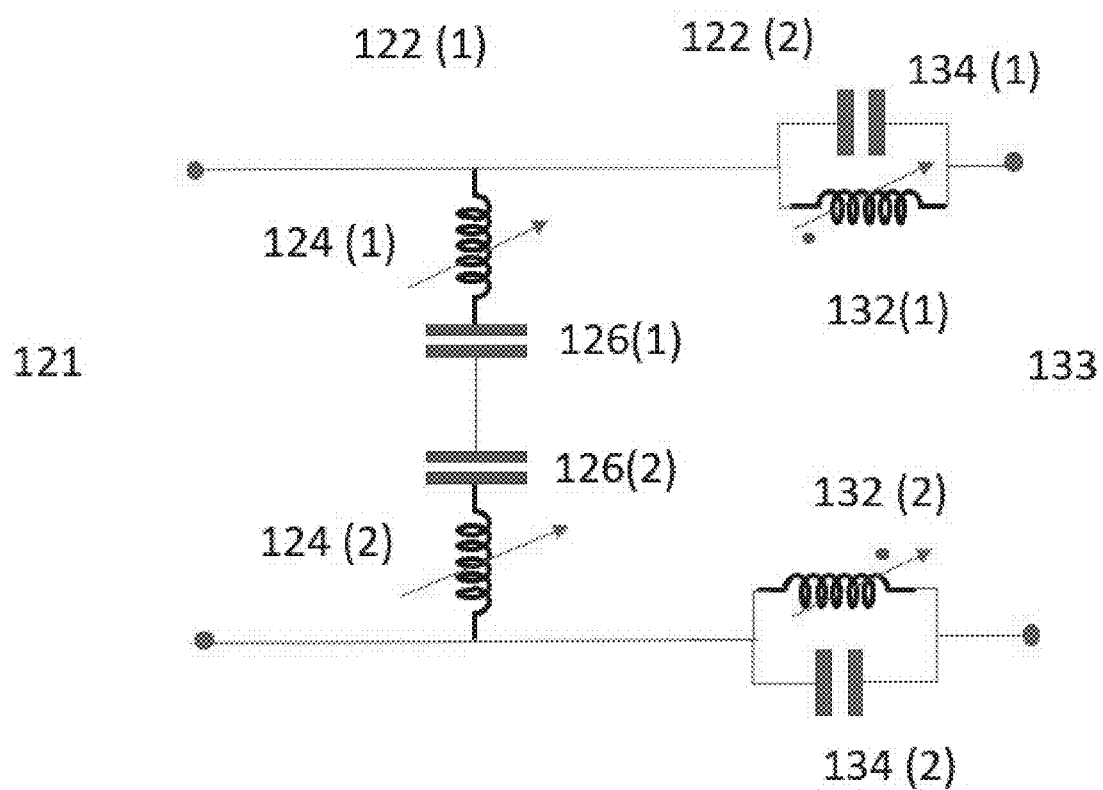
FIG. 7 is a circuit diagram of an example of a tunable notch filter with a shunt and series resonator section.
Figure 9:
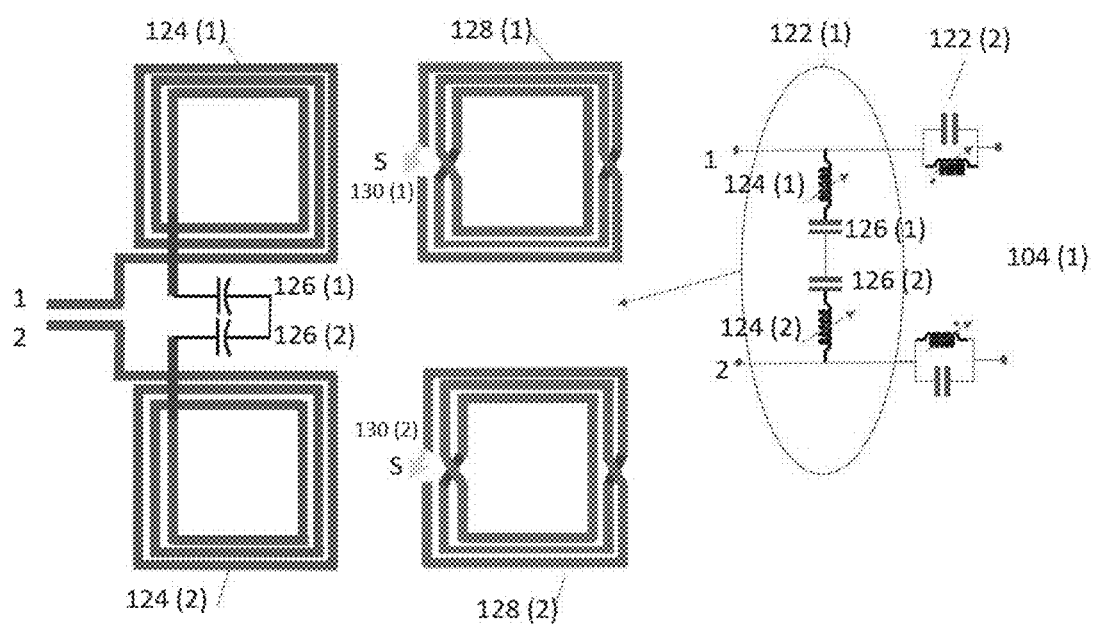
FIG. 9 is an exploded and spread apart view of integrated circuit layers of an example of a tunable notch section of the tunable notch filter with a shunt section.
Figure 10:
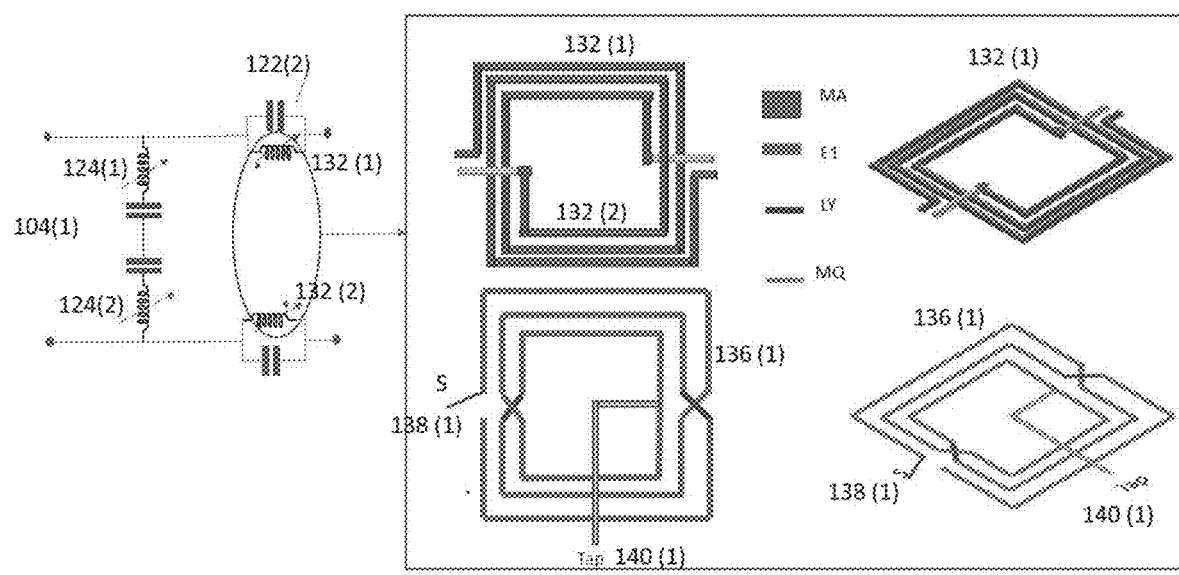
FIG. 10 is an exploded and spread apart view of integrated circuit layers of an example of another tunable notch section of the tunable notch filter.

Referring more specifically to FIG. 7, the exemplary tunable notch filter 104(1) comprises exemplary tunable notch sections 122(1) and 122(2) which are illustrated in FIGS. 7, 9, and 10. A more detailed illustration and description of the structure and operation of examples of tunable differential inductors is provided in U.S. patent application Ser. No. 17/362,015, filed Jun. 29, 2021, entitled, "Differential Tuned Inductor Devices and Methods Thereof" which is herein incorporated by reference in its entirety.

In this example, the tunable notch section 122(1) comprises capacitors 126(1) and 126(2) coupled in series with and between spiral inductors 124(1) and 124(2) which are all coupled across the terminals 121, although the tunable notch section 122(1) could have other types and/or numbers of other elements in other configurations, such as with just fixed spiral inductor by way of example. The terminals 121 of tunable notch section 122(1) are coupled to the input terminals 127 of the tunable notch section 122(2).

The tunable notch section 122(2) comprises capacitors 134(1) and 134(2) which are each coupled in parallel with one of the spiral inductors 132(1) and 132(2) to form a differential tunable inductor device 137. One pair comprising the capacitor 134(1) coupled in parallel with spiral inductor 132(1) and the other pair comprising the capacitor 134(2) coupled in parallel with spiral inductor 132(2) are each, respectively, coupled in series between one of the input terminals 127 and one of the output terminals 133, although the tunable notch section 122(2) could have other types and/or numbers of other elements in other configurations, such as a fixed spiral inductor by way of example.

Referring to FIG. 8, a graph is a graph of fundamental suppression of an example of characteristics of an exemplary tunable notch filter 104(1). In particular, the exemplary tunable notch filter 104(1) can be tuned to about 2.3 GHz when the switches are off and to about 3 GHz when the switches are on in this example, although the tunable notch filter can be configured to be tuned in other manners.

Referring to FIGS. 9 and 10, examples illustrating the ease in which examples of the claims technology can be incorporated into an integrated circuit as well as the reduction in space and components are illustrated. In particular, FIG. 9 shows an example for forming tunable notch section 122(1) and FIG. 10 shows an example for forming tunable notch section 122(2).

More specifically, an example of the tunable notch section 122(1) is shown FIG. 9. In this example, the tunable notch section 122(1) includes the spinal inductors 124(1) and 124(2) which each respectively comprise one of the metal layers 125(1) and 125(2), respectively, formed for each, as shown on the left side of FIG. 9, with the capacitors 126(1) and 126(2) coupled in series between these metal layers 125(1) and 125(2). The spinal inductors 124(1) and 124(2) comprising the metal layers 125(1) and 125(2), respectively, without lower metal layers 128(1) and 128(2), would each form a fixed device. In this example, the tunable notch section 122(1) also includes metal layers 128(1) and 128(2) which are adjacent, but spaced from (in this example below) each of the spinal inductors 124(1) and 124(2), respectively, as shown on the right side of FIG. 9. For ease of illustration the metal layers 128(1) and 128(2) are shown in the right hand side of FIG. 9, but in this example are positioned as described herein below the metal layers 125(1) and 125(2). Each of the metal layers 128(1) and 128(2) include one of the switches 130(1) and 130(2), respectively, to enable the ability to tune the tunable notch section 122(1). A variety of different types of switches, such as a p-i-n diode, a FET switch, or a varactor, by way of example only, can be used for switches 130(1) and 130(2).

Additionally, an example of the tunable notch section 122(2) is shown in FIG. 10. In this example, the tunable notch section 122(2) includes the spiral inductors 132(1) and 132(2) which are plus and minus side inductors that are equal in value to maintain symmetry and are varied by a common-control that changes both the plus and minus spiral inductors 132(1) and 132(2) simultaneously by equal amounts to form a tunable differential inductor device 137. In this example, the pair of spiral inductors 132(1) and 132(2) are located on a first side of a metal structure. In one example, the plus and minus spiral inductors 132(1) and 132(2) are arranged in a planar fashion on the top metal of the metal structure with a bottom metal underpass. The spiral inductors that form the pair of spiral inductors 132(1) and 132(2) can be formed as a wire trace on a chip, for example. Each of the segmented inductors of the pair of spiral inductors 132(1) and 132(2) in this configuration (i.e., the plus and minus side inductors) benefits from the coupling, as one gets a boost in inductance from the other as a result of the coupling. Effectively, the inductance in each of the spiral inductors 132(1) and 132(2) is increased by the factor of its coupling with the adjacent line. This property of the differential inductance allows higher inductance per unit length, and also reduces the length needed and saves area when employed in an artificial delay line, for example. One of the output terminals 133 is coupled in series to the capacitor 134(1) coupled in parallel with the spiral inductor 132(1) and the other one of the output terminals 133 is coupled to the capacitor 134(2) coupled in parallel with the spiral inductor 132(2) to output to the next stage.

In this example, a third conductor 136 comprising a tertiary pair of conductor coils is adjacent to, but spaced from (in this example below) both of the spiral inductors 132(1) and 132(2). For ease of illustration, the third conductor 136 is shown on the bottom portion of FIG. 10, but is positioned in this example as described above below spiral inductors 132(1) and 132(2). The third conductor 136 or tertiary pair of coils further includes a switch 138 and a tap 140 configured to bias the switch 138 to open or closed state to provide adjustable tuning for the illustrated differential tuned inductor device 137. The switch 138 can be a p-i-n diode, a FET switch, or a varactor, by way of example only. In this example, the third conductor 136 is not in the signal path. Accordingly, this unique configuration provides a number of benefits including saving space and cost.

Accordingly, as illustrated and described by way of the examples herein this technology provides an improved frequency tripler system that has a cascade of differential limiting amplifiers and tunable filters to achieve tripled frequency with effective fundamental signal or tone suppression to serve one or more outputs, such as a direct clock or local oscillator drive. Additionally, as illustrated and described herein examples of this technique can easily and cost effectively be implemented into integrated circuit technology.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A frequency tripler system comprising:
a plurality of differential limiting amplifiers;
a plurality of notch filters, wherein one of the notch filters is coupled in series after each one of the plurality of differential limiting amplifiers;
wherein a first pair of a first one of the differential limiting amplifiers coupled in series with a first one of the plurality of notch filters is configured to generate an output comprising a third harmonic signal with fundamental signal, wherein the third harmonic signal is stronger than the fundamental signal;
wherein subsequent pairs of one of the other ones of the differential limiting amplifiers coupled in series with one of the other ones of the plurality of notch filters are configured to pass the triple frequency signal and provide suppression of the fundamental signal relative to the third harmonic signal by desensitization; and
wherein one or more last pairs of one of the other ones of the differential limiting amplifiers coupled in series with one of the other ones of the plurality of notch filters each have an output configured to provide the triple frequency signal.

2. The system as set forth in claim 1 wherein one or more of the differential limiting amplifiers comprises a differential cascode.

3. The system as set forth in claim 1 wherein one or more of the differential limiting amplifiers comprises a bipolar source coupled pair.

4. The system as set forth in claim 1 wherein one or more of the differential limiting amplifiers comprises a MOS source coupled pair.

5. The system as set forth in claim 1 wherein one or more of the notch filters comprises a tunable notch filter.

6. The system as set forth in claim 5 wherein the tunable notch filter further comprises at least one tunable notch section comprising plus and minus side inductors that are equal in value to maintain symmetry, are each configured in a layout adjacent each other to each increase inductance in the other, and are varied by a common-control inductor that changes both the plus and minus spiral inductors simultaneously by equal amounts to form a tunable differential inductor device.

7. The system as set forth in claim 5 wherein the tunable notch filter further comprises:
a first tunable notch section coupled to a second tunable notch section;
wherein the first tunable section comprises a pair of first capacitors coupled in series to each other and between a pair of first spiral inductors; and
wherein the second tunable section comprises:
a first spiral inductor coupled in parallel with a first capacitor and which are both coupled in series between an inductor terminal of one of the pair of spiral inductors in the first tunable section and an output terminal of the second tunable section;
a second spiral inductor coupled in parallel with a second capacitor and which are both coupled in series between an inductor terminal of another one of the pair of spiral inductors in the first tunable section and another output terminal of the second tunable section; and
a tertiary pair of coils including a switch and a tap configured to bias the switch, the switch having a first switch position to electrically open the tertiary pair of coils and a second switch position to electrically close the tertiary pair of coils to reduce differential inductance, wherein the tertiary pair of coils is adjacent, but spaced from the first spiral conductor and the second spiral conductor.

8. A method for making a frequency tripler system, the method comprising:
providing a plurality of differential limiting amplifiers;
coupling one of a plurality of notch filters in series after each one of the plurality of differential limiting amplifiers;
wherein a first pair of a first one of the differential limiting amplifiers coupled in series with a first one of the plurality of notch filters is configured to generate an output comprising a third harmonic signal with fundamental signal, wherein the third harmonic signal is stronger than the fundamental signal;
wherein subsequent pairs of one of the other ones of the differential limiting amplifiers coupled in series with one of the other ones of the plurality of notch filters are configured to pass the triple frequency signal and provide suppression of the fundamental signal relative to the third harmonic signal by desensitization; and
wherein one or more last pairs of one of the other ones of the differential limiting amplifiers coupled in series with one of the other ones of the plurality of notch filters each have an output configured to provide the triple frequency signal.

9. The method as set forth in claim 8 wherein one or more of the differential limiting amplifiers comprises a differential cascode.

10. The method as set forth in claim 8 wherein one or more of the differential limiting amplifiers comprises a bipolar source coupled pair.

11. The method as set forth in claim 8 wherein one or more of the differential limiting amplifiers comprises a MOS source coupled pair.

12. The method as set forth in claim 8 wherein one or more of the notch filters comprises a tunable notch filter.

13. The method as set forth in claim 12 wherein the tunable notch filter further comprises providing at least one tunable notch section comprising plus and minus side inductors that are equal in value to maintain symmetry, are each configured in a layout adjacent each other to each increase inductance in the other, and are varied by a common-control inductor that changes both the plus and minus spiral inductors simultaneously by equal amounts to form a tunable differential inductor device.

14. The method as set forth in claim 12 wherein the tunable notch filter further comprises:
a first tunable notch section coupled to a second tunable notch section;
wherein the first tunable section comprises a pair of first capacitors coupled in series to each other and between a pair of first spiral inductors; and
wherein the second tunable section comprises:
a first spiral inductor coupled in parallel with a first capacitor and which are both coupled in series between an inductor terminal of one of the pair of spiral inductors in the first tunable section and an output terminal of the second tunable section;
a second spiral inductor coupled in parallel with a second capacitor and which are both coupled in series between an inductor terminal of another one of the pair of spiral inductors in the first tunable section and another output terminal of the second tunable section; and
a tertiary pair of coils including a switch and a tap configured to bias the switch, the switch having a first switch position to electrically open the tertiary pair of coils and a second switch position to electrically close the tertiary pair of coils to reduce differential inductance, wherein the tertiary pair of coils is adjacent, but spaced from the first spiral conductor and the second spiral conductor.

* * * * *